United States Patent [19]
Ogiue

[11] 3,791,882
[45] Feb. 12, 1974

[54] METHOD OF MANUFACTURING SEMICONDUCTOR DEVICES UTILIZING SIMULATANEOUS DEPOSITION OF MONOCRYSTALLINE AND POLYCRYSTALLINE REGIONS

[76] Inventor: Katumi Ogiue, Kodaira-shi, Japan

[22] Filed: Aug. 23, 1967

[21] Appl. No.: 662,646

[30] Foreign Application Priority Data

Aug. 31, 1966 Japan .............................. 41-56903

[52] U.S. Cl. ...................... 148/174, 29/576, 29/580, 117/201, 117/212, 117/213, 117/215, 148/175, 148/187, 148/189, 317/235 R

[51] Int. Cl. ......... H01l 7/36, H01l 5/00, B44d 1/18

[58] Field of Search ..... 148/1.5, 1.6, 174, 175, 187, 148/189, 33.2; 317/234, 235; 117/106, 107.2, 201, 212, 213, 215; 29/580, 576

[56] References Cited

UNITED STATES PATENTS

| | | | |
|---|---|---|---|
| 3,189,973 | 6/1965 | Edwards et al. | 148/175 UX |
| 3,260,902 | 7/1966 | Porter | 317/235 |
| 3,326,729 | 6/1967 | Sigler | 148/175 |
| 3,379,584 | 4/1968 | Bean et al. | 148/175 |
| 3,396,456 | 8/1968 | Weinstein | 148/187 X |
| 3,413,145 | 11/1968 | Robinson et al. | 117/201 |
| 3,424,955 | 1/1969 | Seiter et al. | 148/175 X |
| 3,443,176 | 5/1969 | Agusta et al. | 148/175 X |
| 3,475,661 | 10/1969 | Iwata et al. | 317/234 |

OTHER PUBLICATIONS

Jackson, D. M., "Advanced Epitaxial Processes for Monolithic Integrated-Circuit Applications" Transactions of Metallurgical Soc. of Aime, Vol. 233, March, 1965 pp. 596–602

*Primary Examiner*—L. Dewayne Rutledge
*Assistant Examiner*—W. G. Saba
*Attorney, Agent, or Firm*—Craig, Antonelli & Hill

[57] ABSTRACT

A semiconductor device and a method of manufacturing such device, which includes the step of electrically isolating the respective elements of a semiconductor integrated circuit from each other by means of PN junctions. More specifically, the method disclosed herein includes the steps of forming a silicon dioxide layer on one main surface of an N type silicon substrate in such a manner as to surround a predetermined area of said one main surface, depositing P type silicon layers on said one main surface and said silicon dioxide layer from the vapor phase to integrally form monocrystalline silicon layers and a polycrystalline silicon layer on said one main surface and said silicon dioxide layer respectively, and thereafter introducing an N type impurity from the surface of said polycrystalline silicon layer until it reaches said silicon dioxide layer, thereby defining P type silicon regions surrounded by the N type silicon substrate and the N type polycrystalline silicon layer.

21 Claims, 7 Drawing Figures

INVENTOR
KATUMI OGIUE

BY Craig & Antonelli
ATTORNEYS

PATENTED FEB 12 1974 3,791,882

INVENTOR

KATUMI OGIUE

BY Craig & Antonelli

ATTORNEYS

METHOD OF MANUFACTURING SEMICONDUCTOR DEVICES UTILIZING SIMULTANEOUS DEPOSITION OF MONOCRYSTALLINE AND POLYCRYSTALLINE REGIONS

BACKGROUND OF THE INVENTION

This invention relates to a method of manufacturing a semiconductor device, and more particularly it pertains to a technique of electrically isolating respective elements of an integrated circuit using a semiconductor body as a common substrate thereof.

In the case of a solid-state circuit having a common substrate formed of a semiconductor in which are formed a variety of elements such as transistors, diodes, etc., the technique for electrically isolating the respective elements of such a circuit is critical. The conventional isolation techniques may be divided broadly into two categories; utilization of a semiconductor oxide film and utilization of a PN junction of semiconductors. This invention falls under the latter category.

The simplest method of electrically isolating several semiconductor regions on a semiconductor substrate by means of reversely-biased PN junctions is the method which defines several "islands" by diffusing an impurity from one main surface side of a semiconductor substrate of a first conductivity type, this impurity being adapted for determining a second conductivity type different from the first conductivity type.

Recently, this method has developed into the utilization of the epitaxial deposition technique, which has practically been employed. The method thus developed is the one comprising the steps of preparing s substrate formed of a monocrystalline semiconductor of a first conductivity type, epitaxially growing a monocrystalline semiconductor layer of a second conductivity type different from the first conductivity type on one main surface of the substrate, and thereafter effecting selective diffusion of an impurity to define an annular or grid-like region of the second conductivity type extending from the surface of said epitaxial layer to the surface of the substrate, thereby forming an isolated epitaxial layer of the second conductivity type on the substrate of the first conductivity type. Usually, it is a frequent practice that a low resistivity layer 3 (or buried layer) is made in a surface portion of the substrate as shown in FIG. 1 while the epitaxial layer is caused to possess a high resistivity, considering the manufacture of transistor or the like and the break-down voltage of a junction.

Although the method just described is advantageous in many respects over the initially described method which only consists of a treatment by diffusion, it has the disadvantage that an impurity contained in the highly doped buried layer of the same conductivity type as the epitaxial layer has is automatically doped into the epitaxial layer during the formation of the latter, preventing the normal distribution of the impurity concentration in the epitaxial layer. Consequently, the subsequent diffusion treatment with respect to the epitaxial layer for isolation has been difficult to perform. In other words, the impurity concentration is expressed as a function of the distance from a surface contacting an impurity source and distributed in accordance with a complementary error function or Gaussian distribution. Thus, the deeper the diffused layer, the more rapidly the impurity concentration is decreased. As a result, sufficient isolation is not readily achieved in the position of the epitaxial layer which is in the neighborhood of the substrate, due to the disturbance by auto-doping from the highly doped buried layer and other causes. In order to achieve the desired purpose, it is necessary that a diffusion treatment be effected at a sufficiently high temperature or for a sufficiently long time.

Obviously, the disadvantage described above will also stem from a method of previously forming on a surface portion of a substrate an annular or grid-like high impurity layer of the same first conductivity type as the substrate, and then bringing a layer formed by auto-doping from the high impurity layer into register with an annular or grid-like diffusion layer resulting from the impurity introduction from the surface of the epitaxial layer, thereby forming an isolated epitaxial layer of a second conductivity type.

Accordingly, it is a primary object of this invention to provide an improved electrical isolation technique.

Another object of this invention is to provide a method of readily and accurately forming in a single substrate isolated regions bordered by PN junctions.

A further object of this invention is to provide a substrate for integrated circuit with less parasitic capacitance between isolated regions.

Still further object of this invention is to provide a novel and advantageous device.

This invention is based on the fact that an impurity rapidly diffuses along the grain boundary within a polycrystalline semiconductor. It has been found that the speed of diffusion of boron in monocrystalline silicon at about 1,200°C. is approximately $3 \times 10^{-12}$ cm/sec., while in polycrystalline silicon, it becomes about 10 to 100 times higher than this value.

The gist of this invention resides in that a plurality of monocrystalline semiconductor layers and a polycrystalline semiconductor layer integrally and contiguously provided between the monocrystalline semiconductor layers are formed on a surface of a material serving as a substrate, and that the monocrystalline layers (these layers are used to define circuit elements or as means for providing a desired circuit function) are electrically isolated from each other by the substrate and the polycrystalline layer. To this end, a region of an opposite conductivity type to that of the monocrystalline layers is included in the polycrystalline layer. The formation of this opposite conductivity type region is effected by virtue of the nature of an impurity that is diffused at a high speed into the polycrystalline semiconductor layer (that is, the fact that it has a high diffusion coefficient).

In accordance with an embodiment of this invention, the isolation diffusion is effected with respect to the polycrystalline layer, simultaneously with the introduction of an impurity into the monocrystalline layers by virtue of the difference in diffusion velocity between the polycrystalline layer and the monocrystalline layers, to form circuit elements.

Other objects, advantages and features of this invention will become apparent from the following detailed description taken in conjunction with the accompanying drawings.

DESCRIPTION OF PREFERRED EMBODIMENTS

Figure 1:
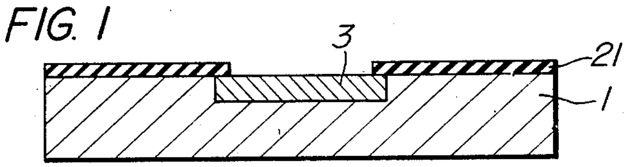
FIGS. 1 to 5 are partial sectional views showing an embodiment of this invention for providing an integrated transistor.
Figure 2:
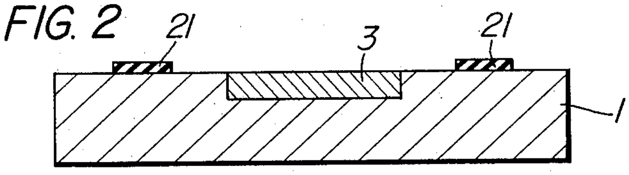
Figure 3:
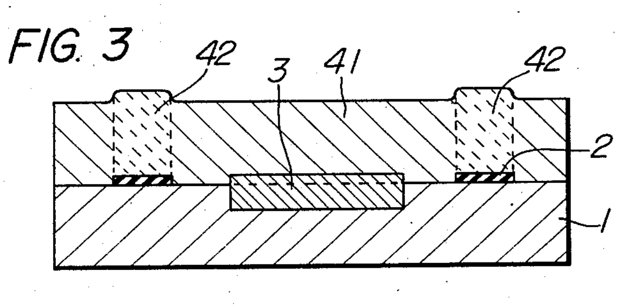
Figure 4:
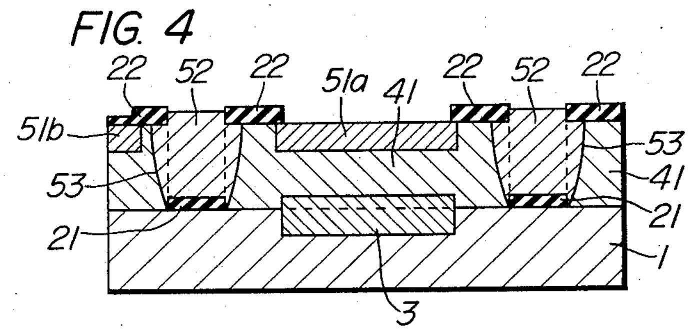

FIGS. 1 to 5 illustrate the respective steps of forming an integrated circuit comprising a transistor provided on a silicon substrate. First, an $n^+$ region 3 (surface resistivity: 20 Ω/cm²) is formed in one main surface of a P type monocrystalline silicon semiconductor 1 having a thickness of 200 microns and a resistivity of 25 Ω·cm by thermally diffusing phosphorus thereinto through the use of a thermally grown oxide film 21 ($SiO_2$) as a mask, as illustrated in FIG. 1. This $n^+$ region is adapted to serve as a low resistivity region in the collector portion after a transistor is formed. Subsequently, the oxide film is removed by a well-known photo-etching technique so that a portion thereof is left which surrounds the $n^+$ region in suitably spaced relationship therewith, as shown in FIG. 2. Thereafter, the silicon substrate is placed in a reaction furnace maintained at an elevated temperature (1,200° – 1,300°C.) in which a gas of silicon halide ($SiCl_4$) containing an N type impurity (phosphorus) flows with a carrier gas ($H_2$), so that a semiconductor silicon layer of about 5 microns in thickness and of several Ω·cm is deposited on the main surface of the silicon substrate. Such a condition is shown in FIG. 3. The silicon layer thus deposited on the substrate consists of a monocrystalline or epitaxial layer 41 and a polycrystalline layer 42 provided on the oxide film 21. The polycrystalline layer 42 is so formed as to project slightly from the monocrystalline layer 41 and appears different in color from the latter. Therefore, the boundary line between these two layers serves to facilitate the accurate positioning of masks used in the succeeding steps. A portion of the monocrystalline layer 41 surrounded by said polycrystalline layer 42 will be utilized as the collector portion of a transistor. Subsequently, a silicon oxide film ($SiO_2$) 5,000 – 7,000 A. in thickness is formed on the surface of the thus deposited silicon layer through thermal oxidation. The oxide film thus formed is covered with a photo-resist film which is configured into a desired pattern by making use of the boundary line between the polycrystalline layer 42 and the monocrystalline layer 41 as described above. The photoresist film is exposed to light rays in accordance with this pattern, and then it is immersed in an etchant in order to expose those portions of the oxide film 22 which correspond to the n+ region 3 and the oxide film 21. The thus exposed oxide film is immersed in an etchant of which the main constituent is fluoric acid (HF) so as to be removed.

Figure 5:
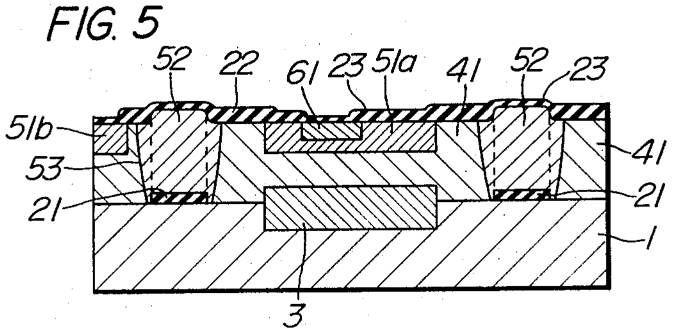

Thereafter, a P-type impurity is thermally diffused by using the remaining portion of the film 22 as a selective mask, thereby forming a P-type base region 51*a*, a P-type region 51*b* of another circuit element (for example, diode), P-type isolating layer 52 and an isolating junction 53. This diffusion is effected at about 1,200°C. by using boron as impurity. In this case, the speed of diffusion with respect to monocrystalline silicon is about $3 \times 10^{-12}$ cm/second, and that with respect to polycrystalline silicon is about 10 to 100 times higher. While the regions 51*a* and 51*b* are formed to have a surface resistivity of 150 Ω/cm² and a thickness of 2 microns, the isolating layer 52 reaches the bottom of the polycrystalline layer, where the oxide film 21 is provided, to surround the N-type layer 41. Thus an isolating band is completed by means of the pn junction 53. In this case, the pn junction is formed in a position which is several microns apart from the boundary between the polycrystalline layer and the monocrystalline layer rather than in the polycrystalline layer. By leaving the oxide film 21 over a large area and effecting diffusion through a small aperture, it is likewise possible to form such a pn junction in the polycrystalline layer. In the structure obtained by the aforementioned method, the parasitic capacitance between the isolated regions becomes lower due to the presence of the oxide film 21, as compared with the conventional structure. Finally, a portion of the oxide film 23 produced during the diffusion of the P-type impurity is removed, and then an N-type impurity (phosphorus) is diffused to define an emitter region 61, as shown in FIG. 5. In this case, the oxide film 23 ($SiO_2$) thus formed will be utilized together with the aforementioned film 21 in the succeeding step of forming electrodes of the element, and ultimately it will be used as a protective film.

Figure 6:
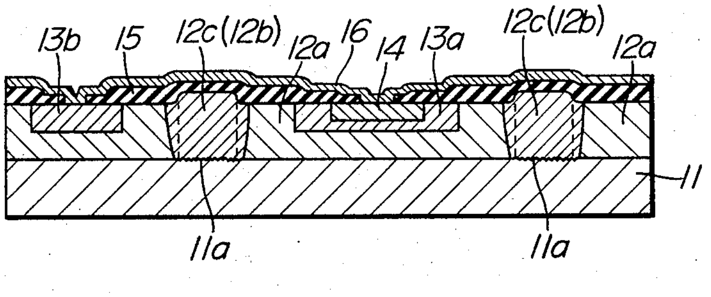
FIG. 6 is a partial sectional view showing another embodiment of this invention.

FIG. 6 shows another embodiment of this invention. In accordance with this embodiment, P-type silicon is vapordeposited onto a substrate (sapphire) 11 with a similar lattice constant to that of silicon to simultaneously form a monocrystalline layer 12*a* and a polycrystalline layer 12*b* which are 5 to 7 microns in thickness. In this case, the sapphire substrate 11 has previously been subjected to sandblast treatment so as to present a rough surface portion 11*a* surrounding a predetermined area thereof. On this surface portion 11*a* is provided a polycrystalline layer 12*b*. Thereafter, selective diffusion treatment is carried out by making use of a silicon oxide film 15 as in the embodiment described above, to form an N-type base region 13*a*, an N-type diode region 13*b*, an N-type isolating region 12*c* (which contains a polycrystalline layer 12*b*) and a P-type emitter region 14. In this case, use is made of phosphorus as the N-type dopant. Finally, an interconnection 16 is formed through vapor-deposition of aluminum.

Figure 7:
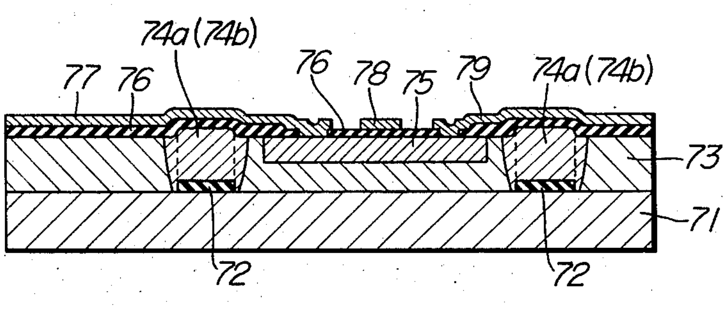
FIG. 7 is a partial sectional view showing an integrated device according to a further embodiment of this invention wherein isolated regions are utilized for interconnection.

FIG. 7 shows still another embodiment of this invention. Although, in the structure according to this embodiment, the same isolating method as that shown in FIG. 5 is employed, the isolated regions are formed with an interconnection in the form of a cross-over construction. The reference numeral 71 represents a P-type silicon substrate, 72 an $SiO_2$ film, 73 an N-type monocrystalline silicon layer, and 74*a* a P-type isolating region (which contains polycrystalline layer 74*b*). In the monocrystalline layer 73 is formed a P-type region 75 with a low resistivity (high concentration of an impurity). An interconnection lead 77 extending over the $SiO_2$ film from one direction is connected with one end of the low resistivity region 75, and another interconnection lead 79 is connected with the other end of the region 75. Another interconnection line 78 is provided on an $SiO_2$ layer 76 to cross over the P-type region 75 by vapor-depositing aluminum thereonto, in addition to the interconnection line formed by the elements 77, 75 and 79. In this way, a cross-over interconnection is completed.

Although several embodiments of this invention have been illustrated and described, it goes without saying that this invention is not limited to such embodiments.

Various modifications will readily occur to those skilled in the art.

For example, the diffusion area 52 may be formed by another diffusion process than a process forming the regions 51*a* and 51*b* of the same conductivity type.

It is also possible to use a semiconductor substrate of the same conductivity type as that of a layer to be deposited thereon, to form a diffusion region of which only a predetermined portion is of opposite conductivity type in the substrate in such a manner as to extend from the front surface thereof to the rear surface thereof, and to achieve isolation by means of this diffusion region and the diffusion region formed in the polycrystalline layer.

What is claimed is:

1. A method for manufacturing a semiconductor device comprising the steps of selectively providing on a major surface of a monocrystalline substrate a modified surface area for preventing a monocrystalline semiconductor layer from being epitaxially grown thereon in the following step, depositing a semiconductor layer of one conductivity type on the major surface of said substrate so as to form a polycrystalline semiconductor layer on said modified surface area and a monocrystalline semiconductor layer on the exposed major surface of said substrate where said modified surface area is not provided, forming an insulating film on the surface of said polycrystalline and monocrystalline semiconductor layers, forming openings in said insulating film to expose surface portions of said polycrystalline and monocrystalline semiconductor layers, and selectively diffusing an impurity of opposite conductivity type to said one conductivity type into said deposited semiconductor layer through said openings so as to simultaneously form a first diffused region in said polycrystalline semiconductor layer to extend to the bottom of said polycrystalline semiconductor layer and a second diffused region in said monocrystalline semiconductor layer to be spaced from the major surface of said substrate.

2. The method according to claim 1, further comprising the steps of forming a second insulating film in said openings and providing on said insulating film an electrode connected to the surface of said diffused region formed in said monocrystalline semiconductor layer and extending over said polycrystalline semiconductor layer with said second insulating film interposed therebetween.

3. The method according to claim 2, wherein said substrate and said deposited semiconductor layer are made of silicon and have opposite conductivity types from each other, and said impurity is selected from the impurities to determine the same conductivity type as that of said substrate.

4. The method according to claim 1, wherein said substrate and said deposited semiconductor layer are made of silicon, and said insulating layer is thermally grown oxide consisting essentially of silicon oxide.

5. The method claimed in claim 1, wherein said substrate is made of sapphire and said deposited semiconductor layer is made of silicon.

6. A method for manufacturing a semiconductor device comprising the steps of selectively providing an insulating layer on a major surface of a monocrystalline substrate; depositing a semiconductor layer of one conductivity type on the major surface of said substrate so as to form a polycrystalline semiconductor layer on said insulating layer and to form a monocrystalline semiconductor layer on the major surface of said substrate where said insulating layer is not provided; forming on the surface of said polycrystalline and monocrystalline semiconductor layers an insulating film having an opening therein so as to selectively expose the surface of said polycrystalline semiconductor layer; and diffusing an impurity of opposite conductivity type to said one conductivity type into said polycrystalline semiconductor layer through said opening.

7. The method according to claim 6, wherein said substrate and said deposited semiconductor layer are made of silicon and said insulating layer is thermally grown oxide consisting essentially of silicon oxide.

8. The method according to claim 6, wherein said substrate has a first conductivity type, said deposited semiconductor layer has a second conductivity type opposite to said first conductivity type, and said impurity is selected from the impurities to determine said first conductivity type.

9. The method according to claim 6, wherein said substrate is made of a P conductivity type silicon, said deposited semiconductor layer is made of silicon containing phosphorus, said insulating film consists essentially of silicon oxide, and said impurity is boron.

10. A method for manufacturing a semiconductor device comprising the steps of forming an insulating layer on a major surface of a monocrystalline semiconductor substrate of one conductivity type, selectively removing a part of said insulating layer to form a first opening therein and expose a part of the major surface of said substrate, diffusing a first impurity of opposite conductivity type to said one conductivity type into said substrate through said first opening, removing said insulating layer except the portion which circumferentially surrounds the first impurity diffused region in those parts where the semiconductor device is to be isolated from adjacent devices, simultaneously depositing a polycrystalline semiconductor layer on the remaining insulating layer and a monocrystalline semiconductor layer on the exposed major surface of said substrate so that said polycrystalline semiconductor layer surrounds said monocrystalline semiconductor layer in said parts, said polycrystalline and said monocrystalline semiconductor layer being of the same conductivity type as said first impurity, forming an insulating film on the surfaces of polycrystalline and monocrystalline semiconductor layers, forming second openings in said insulating film to expose surface portions of said polycrystalline and monocrystalline semiconductor layers so that the exposed surface of said polycrystalline semiconductor layer surrounds the exposed surface of said monocrystalline semiconductor layer in said parts, and selectively diffusing through said second openings a second impurity opposite to the conductivity type of said first impurity into said polycrystalline semiconductor layer to extend to the bottom thereof and into said monocrystalline semiconductor layer to be spaced from said major surface of said substrate.

11. The method according to claim 10, wherein said substrate and said deposited semiconductor layers are made of silicon and said insulating layer essentially consists of silicon oxide.

12. The method according to claim 11, wherein said substrate is made of P type silicon, said first and second impurities are selected from N and P conductivity type determining impurities, respectively, said deposited semiconductor layers are made of N type silicon, and said insulating layer and films consist essentially of silicon oxide.

13. The method according to claim 10, further comprising the steps of forming a second insulating film in said second openings, forming a third opening in said second insulating film to expose a surface portion of the second impurity diffused region formed in said monocrystalline semiconductor layer, diffusing a third impurity of the same conductivity type as said first impurity into said second impurity diffused region through said third opening, and providing a metal electrode connected to the third impurity diffused region, extending over said insulating films and crossing over said polycrystalline semiconductor layer with said second insulating film interposed therebetween.

14. The method according to claim 13, wherein said substrate and said deposited semiconductor layers are made of silicon, and said insulating layer is thermally grown oxide essentially consisting of silicon oxide.

15. A method for manufacturing a semiconductor integrated circuit device comprising the steps of providing an insulating layer with a lattice or ring pattern on a major surface of a monocrystalline semiconductor substrate having a first conductivity type, depositing a semiconductor layer having a second conductivity type opposite to said first conductivity type on the major surface of said substrate so as to simultaneously form a polycrystalline semiconductor region on said insulating layer and a plurality of monocrystalline semiconductor regions separated by said polycrystalline semiconductor region on the major surface of said substrate where said insulating layer is not provided and where said monocrystalline semiconductor regions are isolated from each other, covering the surface of said deposited semiconductor layer with a first insulating film having openings therein to expose the surfaces of said polycrystalline semiconductor region and said monocrystalline semiconductor regions, the latter exposed surfaces being surrounded by the former exposed surface in those circumferential parts where they are isolated from each other, selectively diffusing an impurity of said first conductivity type into said deposited semiconductor layer through said openings so as to simultaneously form a first diffused region of the first conductivity type spaced from the major surface of said substrate in each of said monocrystalline semiconductor regions and a second diffused region of the first conductivity type substantially extending to the bottom of said polycrystalline semiconductor region and having the lattic or ring pattern in said polycrystalline semiconductor region, said first diffused regions being thereby surrounded by said second diffused region in those adjacent circumferential parts where they are isolated from each other, covering said openings with a second insulating film, providing interconnection layers extending over said first insulating film and crossing over said polycrystalline semiconductor region with said second insulating film interposed to electrically connect said monocrystalline regions which are isolated by said substrate and said polycrystalline semiconductor region of the first conductivity type from each other.

16. The method according to claim 15, wherein said substrate and said deposited semiconductor layer are made of silicon and said insulating layer consists essentially of silicon oxide.

17. A method for manufacturing a semiconductor device comprising the steps of simultaneously depositing a monocrystalline semiconductor region and a polycrystalline semiconductor region on a major surface of a monocrystalline semiconductor substrate and causing the surface of said polycrystalline semiconductor region to project above the surface of said monocrystalline semiconductor region, said monocrystalline region and said polycrystalline region being of a first conductivity type, whereby a boundary line is formed between said two regions at the surface thereof, and positioning masks to be used in succeeding steps along said boundary line, and selectively diffusing an impurity of opposite conductivity type to said first type into said two regions through the masks.

18. A method for manufacturing a semiconductor device characterized in that an insulating film is selectively formed on a major plane surface of a monocrystalline semiconductor substrate, a semi-conductor layer of one conductivity type is deposited on said substrate so as to simultaneously form a monocrystalline semiconductor region on the major surface of said substrate where said insulating layer is not formed and a polycrystalline semiconductor region slightly projecting from said monocrystalline semi-conductor region on said insulating layer, whereby a boundary line is formed between said polycrystalline and monocrystalline semiconductor region at the surface thereof, and positioning masks to be used in succeeding steps along said boundary line, and selectively diffusing an impurity of opposite conductivity type to said one conductivity type into said two regions through the masks.

19. The method according to claim 18, wherein said substrate and said deposited semiconductor layer are made of silicon, and said insulating layer is a thermally grown oxide essentially consisting of silicon oxide.

20. A method for manufacturing a semiconductor device comprising the steps of oxidizing a monocrystalline silicon substrate surface to form a thermally grown insulating film essentially consisting of silicon oxide thereon, selectively removing said insulating film to partially expose the surface of said silicon substrate, depositing a semiconductor layer of one conductivity type on said remaining insulating film and said exposed substrate surface from vapor phase, whereby a polycrystalline and a monocrystalline semiconductor layer are formed on said remaining insulating film and said exposed substrate surface, respectively, and selectively diffusing an opposite conductivity type determining impurity to said one conductivity type into said polycrystalline semiconductor layer.

21. The method claimed in claim 20, wherein said substrate has a first conductivity type, said deposited monocrystalline layer has a second conductivity type opposite to said first conductivity type, and said impurity to be diffused into said deposited polycrystalline layer is selected from the first conductivity type determining impurities.

* * * * *

UNITED STATES PATENT OFFICE

CERTIFICATE OF CORRECTION

Patent No. 3,791,882 Dated February 12, 1974

Inventor(s) Katumi OGIUE

It is certified that error appears in the above-identified patent and that said Letters Patent are hereby corrected as shown below:

Title page, insert the following:

[73] Assignee: Hitachi, Ltd.
Tokyo, Japan

Signed and sealed this 23rd day of July 1974.

(SEAL)
Attest:

McCOY M. GIBSON, JR.
Attesting Officer

C. MARSHALL DANN
Commissioner of Patents